United States Patent [19]

Jaskolski et al.

[11] 4,119,845
[45] Oct. 10, 1978

[54] THERMALLY-SENSITIVE, PHOTO-CONTROLLED SEMICONDUCTOR SWITCHING SYSTEMS

[75] Inventors: Stanley V. Jaskolski, Sussex; Robert W. Lade, Waukesha; Herman P. Schutten, Elm Grove, all of Wis.

[73] Assignee: Cutler-Hammer, Inc., Milwaukee, Wis.

[21] Appl. No.: 779,639

[22] Filed: Mar. 21, 1977

[51] Int. Cl.² .............................................. G01D 5/34
[52] U.S. Cl. .................. 250/231 R; 250/229; 350/351
[58] Field of Search ................ 250/231 R, 238, 551, 250/237 R, 229; 350/160 P, 160 LC; 73/355, 356; 307/311

[56] References Cited

U.S. PATENT DOCUMENTS

| 2,666,583 | 1/1954 | Whitney | 350/160 P |
| 2,792,484 | 5/1957 | Gurewitsch et al. | 350/160 P |
| 3,654,474 | 4/1972 | Jacobs | 250/237 R |
| 3,719,789 | 3/1973 | Harnden | 350/160 LC |

Primary Examiner—David C. Nelms
Attorney, Agent, or Firm—Hugh R. Rather; William A. Autio; Michael E. Taken

[57] ABSTRACT

A switching system having a photo-sensitive power switching or control element such as a photo SCR, photo triac, photo transistor or the like that is normally turned on or off by coupled light from a controlled light source such as an LED (light emitting diode), neon lamp, incandescent lamp or the like. A thermally-sensitive light-gating element such as an LC (liquid crystal) element controls the light impinging on the photo-sensitive element. The gating element may sense the temperature of the photo-sensitive power switching or control element directly if the two are integral in which case the combined device would be self-protecting. On the other hand, the gating element may be separate and may be arranged to sense the temperature of an external source that may or may not be controlled by the photo-sensitive power switching or control element in which case the latter would be controlled by the temperature. Different types of temperature-sensitive gating elements or combinations thereof may be used in the systems.

16 Claims, 9 Drawing Figures

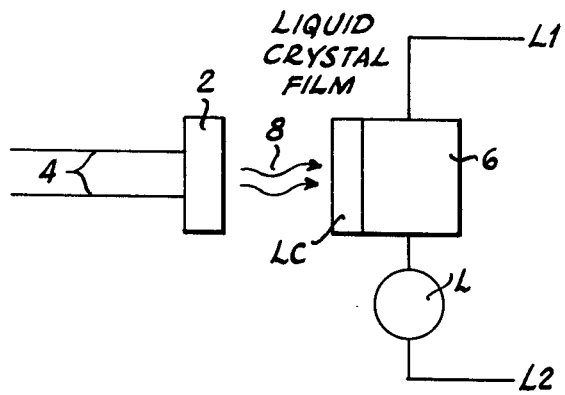
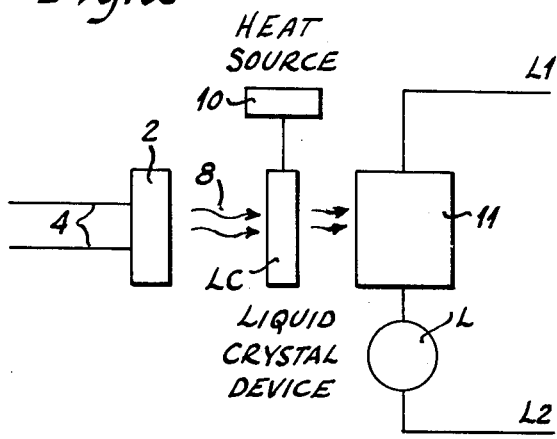
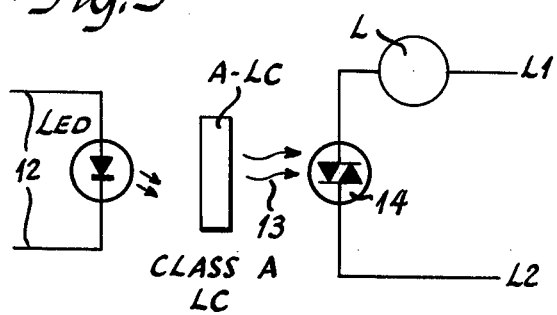
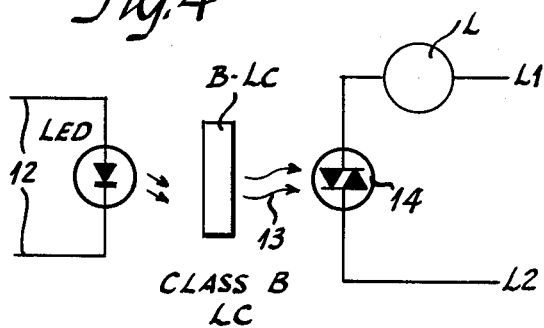
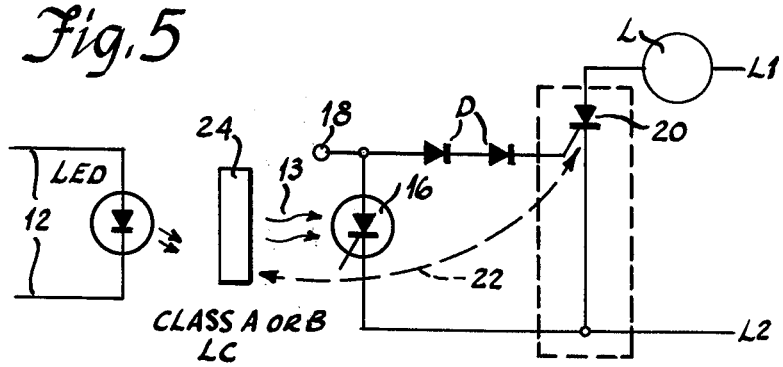
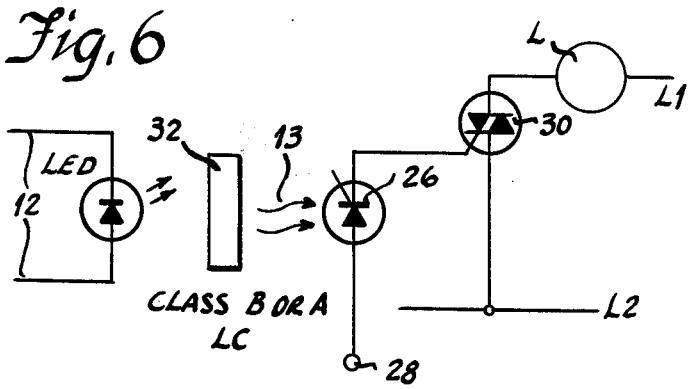
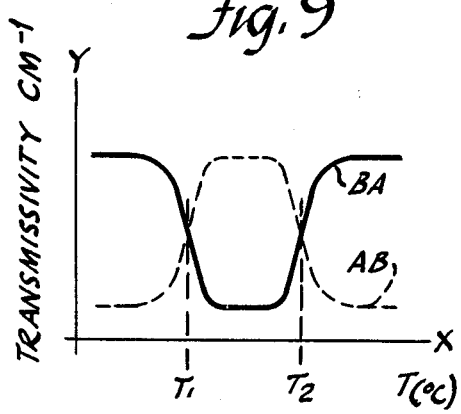

4,119,845

THERMALLY-SENSITIVE, PHOTO-CONTROLLED SEMICONDUCTOR SWITCHING SYSTEMS

BACKGROUND OF THE INVENTION

It has been known to place a temperature-sensing element such as a thermistor in heat transfer relation with a thyristor by mounting it on the thyristor case. Such thermistor has been connected in the thyristor firing control circuit to regulate the thyristor current flow for temperature-compensation purposes, that is, to maintain the thyristor temperature below a damaging value. It has also been known to mount a thermistor in heat transfer contact with a semi-conductor device and to connect such thermistor in the gate circuit of the semiconductor to prevent excessive junction temperatures. Also, it has been known to mount a thermally-sensitive thyristor in heat transfer relation with a load and connect it to control the load-energizing thyristor. Furthermore, it has been known to gate control a thyristor by a light source acting on a photo-sensitive element connected in the thyristor gate circuit.

While these prior systems have been useful for their intended purposes, this invention relates to improvement thereover.

SUMMARY OF THE INVENTION

An object of the invention is to provide an improved thermally-sensitive, photo-controlled semiconductor switching system.

A more specific object of the invention is to provide an integral self-protecting, photo-sensitive solid state power switch.

Another specific object of the invention is to provide a photo-sensitive solid state power switch with temperature-responsive protective means.

Another specific object of the invention is to provide a photo-sensitive solid state power switch with temperature-sensitive control means.

Another specific object of the invention is to provide a photo-sensitive semiconductor power switch with thermally-induced turn-on means.

Another specific object of the invention is to provide a photo-sensitive semiconductor power switch with thermally-inhibited turn-on means.

Another specific object of the invention is to provide a photo-sensitive semiconductor power switch with thermally-induced turn-on means directly responsive to such power switch temperature.

Another specific object of the invention is to provide a photo-sensitive semiconductor power switch with thermally-inhibited turn-on means directly responsive to such power switch temperature.

Another specific object of the invention is to provide a photo-sensitive semiconductor power switching system with a temperature-sensitive light-passage control means.

Another specific object of the invention is to provide a system of the aforementioned type having light-passage control means that passes operating light at and above a predetermined temperature thereof.

Another specific object of the invention is to provide a system of the aforementioned type having light-passage control means that passes operating light below a predetermined temperature thereof.

Another specific object of the invention is to provide a system of the aforementioned type having light-passage control means that passes operating light within a predetermined range or ranges of temperature values thereof.

Other objects and advantages of the invention will hereinafter appear.

BRIEF DESCRIPTION OF THE DRAWINGS

FIG. 1 is a schematic illustration of a thermally-sensitive, photo-controlled semiconductor power switching system wherein the thermally-sensitive means is an integral LC (liquid crystal) film on the photo-controlled semiconductor switch element in direct heat transfer relation therewith;

FIG. 2 is a schematic illustration of a thermally-sensitive, photo-controlled semiconductor power switching system wherein the thermally-sensitive means is an LC that senses the temperature of an external heat source to control the light impinging on the power switching element;

FIG. 3 is a schematic illustration of a thermally-induced turn-on switching system using an LC of Class A in the light path;

FIG. 4 is a schematic illustration of a thermally-inhibited, turn-on switching system using an LC of Class B in the light path;

FIG. 5 is a schematic illustration of a thermally-inhibited, turn-on switching system using an LC of Class A in the light path, or a thermally-induced, turn-on switching system if a Class "B" LC is used, and a normal gating signal is present;

FIG. 6 is a schematic illustration of a thermally-inhibited, turn-on switching system using a Class "B" LC, or a thermally-induced, turn-on switching system if a Class "A" LC is used which prevents turn-on if the temperature falls below a predetermined value;

FIG. 7 shows an LC device called an AB device, being a combination of mixture of Class A and Class B liquid crystals with predetermined transition temperatures between opaqueness and transparency;

FIG. 8 shows an LC device called a BA device, being a combination or mixture of Class B and Class A liquid crystals with predetermined portions and transition temperatures between transparency and opaqueness; and FIG. 9 is a graph having curves showing bands or "windows" of thermal actuation and deactuation with uses of the AB and BA elements of FIGS. 7 and 8 in the systems of FIGS. 3–6 in place of the LC's therein.

DESCRIPTION OF THE PREFERRED EMBODIMENTS

Referring to FIG. 1, there is shown a thermally-sensitive, photo-controlled semiconductor power switching system constructed in accordance with the invention. As shown therein, a light source 2 is energized from an electric power source through a pair of conductors 4, this being the control input to the system. Thus, when this light is lit, the system operates under normal conditions in the following manner.

The light from the aforementioned light source impinges on a photo-sensitive element 6 by first passing through a control or gating device. This control device is a thermal-sensitive liquid crystal LC in the form of a thin film attached to or adhering to the adjacent surface of photo-sensitive element 6. A load L is connected to be energized from an AC source through power supply lines L1 and L2 and photo-controlled power switching element 6.

From the foregoing, it will be apparent that under a given temperature condition, gating device LC is transparent to the extent that sufficient light indicated by arrows 8 passes therethrough and impinges on photo-controlled element 6. This light causes turn-on of element 6 to allow current to flow therethrough to energize load L.

Photo-controlled element 6 may be a photo-thyristor such as a photo SCR or photo triac, a photo transistor, or the like that is controlled or gated by an impinging light to control energization of a load device.

When thermal-sensitive device LC reaches another temperature as by heat transfer from power control element 6, it becomes opaque enough so that now insufficient light passes therethrough for turn-on of element 6. This causes thermal turn-off of element 6 to cut power from the load.

When the heat transfer is directly from power element 6 to gating or control element LC, the arrangement functions as a self-protective system that prevents the power element from reaching a destructive temperature. Thus, whenever the power element approaches too high a temperature in load energization use, element LC will turn it off to let it cool down. Thereupon when element LC cools, it will allow turn-on of power element 6.

FIG. 2 shows a system similar to FIG. 1 except that heat-sensitive element LC receives heat from an external source 10, not directly from power switching element 11. In this version, reference characters similar to this in FIG. 1 have been used for like elements. Light source 2 may be an LED (light emitting diode), neon lamp, incandescent lamp or the like. When this light source 2 is energized with electric current from a power source through conductors 4, light passes therefrom through heat-sensitive element LC and impinges on power switching element 11 to turn it on. When heat from source 10 is transmitted to element LC to change its temperature and render it opaque, element LC cuts off enough light to turn element 11 off. This external heat source may constitute a separate heat generator or it may receive heat from load L or indirectly from the load circuit. Element 11 is similar to element 6 but with the LC film removed.

FIG. 3 shows use of a Class "A" LC device to provide a thermal-induced turn-on power switching system which could be used as a thermostat for low temperature applications. In this system, an LED is energized from an electric power source through conductors 12. When so energized, this LED emits light shown by arrows 13 that is directed to a photo-thyristor 14 such as a photo-triac connected in series with a load L through lines L1 and L2 across an AC power source. A Class "A" LC is in the light path between the LED and the photo-thyristor. This Class "A" LC is a liquid crystal element designed so that it is opaque at low temperature but becomes transparent at a higher predetermined temperature T1. This temperature T1 may be any desired value within limits depending upon the design of the Class "A" LC.

Initially at low temperature, element A-LC is opaque and blocks the light from the photo-thyristor so that the latter remains off. As the temperature of the Class A LC increases to value T1, the latter becomes transparent to pass enough light to cause photo-thyristor 14 to turn-on and energize load L. In this manner, this system provides a thermal-induced turn-on power switch since the rise in temperature of the LC is effective to effect turn-on of the load.

FIG. 4 shows use of a Class "B" LC device to provide a thermal-inhibited turn-on power switching system applicable for use as a high temperature thermostat. In FIG. 4 reference characters like those in FIG. 3 have been used for like elements. In this system, an LED is energized from an electric power source through conductors 12. When so energized, this LED emits light indicated by arrows 13 that is directed to a photo-thyristor 14 such as a photo-triac connected in series with a load L through lines L1 and L2 across an AC power source. A Class "B" LC is in the light path between the LED and the photo-thyristor. This Class "B" LC is a liquid crystal element designed so that it is transparent at low temperature but becomes opaque at a higher predetermined temperature T2. This temperature T2 may be the same as or different from the aforementioned temperature T1 of the Class "A" LC and may have any desired value within limits depending upon the design of the Class "B" LC.

Initially at low temperature, element B-LC is transparent and passes light to the photo-thyristor so that the load is on. As the temperature of the Class "B" LC increases to value T2, the latter becomes opaque and blocks the light from the photo-thyristor to allow the latter to turn off and deenergize the load. Thus, this turn-on power switching system is a thermal inhibited type because increasing temperature turns it off. Placing this Class B device element in close thermal contact with a power switch that is to be optically activated will inhibit turn-on above a critical temperature thus providing a type of thermal overload protection.

FIG. 5 shows a system where a thermally-controlled photo-thyristor is connected in shunt of the gate of an electrically-gated power switching thyristor. This system can provide either a thermal-inhibited or a thermal-induced turn-on power switching function depending upon whether a Class "A" or a Class "B" LC is used in the light path as hereinafter more fully described.

Let it first be assumed that a Class "A" LC is used in FIG. 5. An LED is energized from an electric power source through conductors 12 which causes it to emit light indicated by arrows 13 that impinges on a photo-thyristor 16. This photo-thyristor is connected between an input terminal 18 and the cathode of a power switching thyristor 20. Input terminal 18 is also connected through a pair of diodes D in series in their forward low impedance direction to the gate of thyristor 20. A load L is connected in series with thyristor 20 and lines L1 and L2 across an AC power source. As indicated by arrow 22, liquid crystal element 24 is in direct heat transfer relation with thyristor 20 to provide for self-protection from thermal overloads.

Since this liquid crystal 24 is Class A and thus opaque at low temperature, insufficient light passes therethrough so that photo-thyristor 16 is off. Consequently, an electrical signal at input terminal 18 gates power switching thyristor 20 on to energize the load.

If the temperature of thyristor 20 rises sufficiently so that conduction of heat to liquid crystal 24 renders the latter transparent, the light now impinging on photo-thyristor 16 turns it on to shunt the gate circuit of power switching thyristor 20. This causes thyristor 20 to turn off to deenergize the load or prevents the power thyristor from being gated on during thermal overloads for self-protection. Reverse current blocking diodes D provide enough voltage drop to offset the voltage drop on photo-thyristor 16 to insure turn-off of power switching thyristor 20. Thus, thermal-inhibited action has occurred.

Alternatively, a Class "B" LC may be used in FIG. 5 to afford thermal-induced turn-on of the load device. Under this condition, since liquid crystal 24 is transparent at low temperature, light from the LED passes therethrough and impinges on photo-thyristor 16 to turn it on. This photo-thyristor shunts the gate-cathode junction of power switching thyristor 20 to keep the load deenergized.

However, if heat is now applied from an external source to liquid crystal 24, at a critical temperature it will become opaque enough to shut the light off from photo-thyristor 16, causing the latter to turn off. As a result, this removal of the shunt allows the electrical signal at input terminal 18 to gate power switching thyristor on to energize the load. Thus, thermally-induced turn-on of the load has been performed.

FIG. 6 shows a system where a thermally-controlled photo-thyristor is connected in series with the gate of an electrically-gated power switching thyristor. This system can provide either a thermal-inhibited or a thermal-induced turn-on power switching function depending upon whether a Class "B" or a Class "A" LC is used in the light path.

While the gate shunt connection of the photo-thyristor in FIG. 5 provided thermal-inhibited action with a Class "A" LC and thermal-induced action with a Class "B" LC, this series connection of the photo-thyristor in FIG. 6 provides the opposite, that is, thermal-inhibited action with a Class "B" LC and thermal-induced action with a Class "A" LC as hereinafter more fully described.

Let it first be assumed that a Class "B" LC is used in FIG. 6. An LED is energized from an electric power source through conductors 12 which causes it to emit light indicated by arrows 13 that impinges on photo-thyristor 26. This photo-thyristor is connected between an input terminal 28 and the gate of a power switching thyristor 30. A load L is connected in series with thyristor 30 and lines L1 and L2 across an AC source. Liquid crystal element 32 is in the light path between the LED and the photo-thyristor.

Since this liquid crystal element 32 is Class B and thus transparent at low temperature, light passes therethrough to impinge on photo-thyristor 26 to turn it on. As a result, an electrical signal at input terminal 28 passes through this photo-thyristor to the gate of power switching thyristor 30 to cause energization of the load device L. When heat is applied to liquid crystal element 32, it becomes opaque at a predetermined rising temperature to cut off the light from the photo-transistor. This renders the latter non-conducting thereby to deenergize the load by the aforesaid thermal-inhibit action. If this LC element is coupled to the power thyristor in heat transfer relation, this circuit provides self-protection against thermal overloads.

Alternatively, a Class "A" LC may be used for element 32 in FIG. 6 to afford thermal-induced turn-on of the load device. Since liquid crystal element 32 is opaque at low temperature, the load is normally off. When heat is applied to element 32, it becomes transparent and passes light to photo-thyristor 26 to render the latter conducting. As a result, an input signal from terminal 28 goes to the gate of power switching thyristor 30 to turn it on and energize the load. Thus, thermal-induced turn-on action is attained.

Liquid crystal element 32 in FIG. 6 may obtain heat transfer directly from thyristor 30, from the load or from an external source.

FIGS. 7 and 8 show schematically Class AB and Class BA liquid crystals. These are combinations or mixtures of Class A and Class B materials in predetermined amounts and arrangements to afford the functions shown in the graph in FIG. 9.

In the graph in FIG. 9, light transmissivity increases upwardly as the y axis while temperature in degrees C. increases to the right as the X axis. The broken line and solid line curves show characteristics of the Class AB and Class BA liquid crystal elements, respectively. As will be apparent, these two curves depict "windows" of transmissivity and opaqueness, respectively. This curve AB presupposes that the temperature at which the Class A part of the material of the Class AB liquid crystal element becomes transparent is lower as indicated by T1, than the temperature at which the Class B part thereof becomes opaque as indicated by T2. As to curve BA, it is also presupposed that the temperature at which the Class B part of the material of the Class BA liquid crystal element becomes opaque is lower, as indicated by T1, than the temperature at which the Class A part thereof becomes transparent as indicated by T2.

Referring now to broken-line curve AB in FIG. 9, it will be apparent that the LC element is substantially opaque at and below temperature T1. As the temperature rises, the light transmissivity of this element increases to a significantly greater value for a predetermined range of further temperature rise. As the temperature rises to or near value T2, the light transmissivity of this element decreases until it becomes substantially opaque again. Thus, there is provided a range or "window" of light transmissivity.

Referring now to solid-line curve BA in FIG. 9, it is seen that the Class "BA" LC element is substantially transparent at and below temperature T1. As the temperature rises, the light transmissivity of this element decreases to a significantly lower value for a predetermined range of further temperature rise. As the temperature rises to or near the value T2, the light transmissivity of this element increases until it becomes substantially transparent again as shown by the curve.

In the foregoing description, it should be kept in mind that opaqueness and transparency are relative terms and that the changes that occur in the Class AB and Class BA liquid crystal elements are matters of degree, not absolutes. This is indicated in FIG. 9 by the lowest parts of these curves being some distance above the X-axis of the graph and the highest parts thereof being some distance below the maximum transmissivity value possible. The degree of change in transmissivity with change in temperature of the element is an effective and useful amount and the photo-thyristor may be designed to be sensitive to that degree of change in the light impinging thereon.

While the systems hereinbefore described are effectively adapted to fulfill the objects stated, it is to be understood that the invention is not intended to be confined to the particular preferred embodiments of thermally-sensitive, photo-controlled semiconductor switching systems disclosed, inasmuch as they are susceptible of various modifications without departing from the scope of the appended claims.

We claim:

1. An electrical power switching system comprising: an electric power supply source;

a load device;

means comprising a photo-sensitive, semiconductor switching element operable upon activation thereof for controlling application of power from said source to said load device;

a light source normally operable to provide light impinging on said photo-sensitive, semiconductor switching element for activation thereof;

thermally-sensitive, variable light transmission means interposed in the light path between said light source and said photo-sensitive, semiconductor switching element to vary the light passing through said light transmission means thereby to control said photo-sensitive, semiconductor switching element in response to change in temperature of said thermally-sensitive, variable light transmission means;

and means coupling heat from said semiconductor switching element to said thermally-sensitive variable light transmission means.

2. The electrical power switching system claimed in claim 1, wherein:

said means comprising a photo-sensitive, semiconductor switching element comprises a photo-sensitive thyristor and conductors electrically connecting it to said source and load device.

3. An electrical power switching system comprising:

an electric power supply source;

a load device;

means comprising a photo-sensitive, semiconductor switching element operable upon activation thereof for controlling application of power from said source to said load device;

a light source normally operable to provide light impinging on said photo-sensitive, semiconductor switching element for activation thereof;

thermally-sensitive, variable light transmission means comprising a liquid crystal film interposed in the light path between said light source and said photo-sensitive, semiconductor switching element to vary the light passing through said light transmission means thereby to control said photo-sensitive, semiconductor switching element in response to change in temperature of said thermally-sensitive variable light transmission means;

and means coupling variable heat to said thermally-sensitive, variable light transmission means comprising integral construction and direct contact between said film and said photo-sensitive, semiconductor switching element.

4. The electrical power switching system claimed in claim 3, wherein:

said liquid crystal film is relatively transparent at low temperatures so as to pass sufficient light for activation of said photo-sensitive, semiconductor switching element and becomes relatively opaque upon increase of its temperature to a predetermined level thereby to provide a thermally self-protecting power switching system.

5. The electrical power switching system claimed in claim 1, wherein:

said thermally-sensitive, variable light transmission means comprises a liquid crystal element that is relatively opaque at a first range of temperatures and changes to relatively transparent at another range of temperatures and being operable to photo-electrically gate said photo-sensitive semi-conductor switching element at a predetermined temperature level between said two temperature ranges.

6. The electrical power switching system claimed in claim 5, wherein:

said liquid crystal element is a Class A element that is relatively opaque at low temperatures and changes to relatively transparent at a predetermined level of its rising temperature thereby to afford thermally-induced turn-on of the system.

7. The electrical power switching system claimed in claim 5, wherein:

said liquid crystal element is a Class B element that is relatively transparent at low temperatures and changes to relatively opaque at a predetermined level of its rising temperature thereby to afford a thermally-inhibited, turn-on system.

8. The electrical power switching system claimed in claim 5, wherein:

said liquid crystal element is a Class BA element that is relatively transparent at low temperatures, changes to relatively opaque at a first predetermined level of its rising temperature, and changes back to relatively transparent at a second predetermined level of its still further rising temperature thereby to provide a window of relatively opaqueness with increasing temperature.

9. The electrical power switching system claimed in claim 5, wherein:

said liquid crystal element is a Class AB element that is relatively opaque at low temperatures, changes to relatively transparent at a first predetermined level of its rising temperature, and changes back to relatively opaque at a second predetermined level of its still further rising temperature thereby to afford a window of relative transparency with increasing temperature.

10. The electrical power switching system claimed in claim 5, wherein said means comprising a photo-sensitive, semiconductor switching element also comprises:

a thyristor power switch connected for energizing said load across said source, said thyristor power switch having a pair of power terminals and a gate terminal;

said photo-sensitive, semiconductor switching element being connected to shunt said gate to one of said power terminals when it is activated;

and an input terminal for applying an input gating signal to the gate terminal of said thyristor power switch.

11. The electrical power switching system claimed in claim 5, wherein said means comprising a photo-sensitive, semiconductor switching element also comprises:

a thyristor power switch connected for energizing said load across said source, said thyristor having a pair of power terminals and a gate terminal;

an input terminal for applying an input gating signal to the gate terminal of said thyristor power switch;

and said photo-sensitive, semiconductor switching element being connected between said input terminal and said gate terminal.

12. An electrical power switching system comprising:

an electric power supply source;

a load device;

means comprising a photo-sensitive, semiconductor switching element operable upon activation thereof for controlling application of power from said source to said load device and a thyristor power switch connected for energizing said load across said source, said thyristor power switch having a pair of power terminals and a gate terminal;

said photo-sensitive, semiconductor switching element being connected to shunt said gate terminal to one of said power terminals when it is activated;

an input terminal for applying an input gating signal to the gate terminal of said thyristor power switch;

a light source normally operable to provide light impinging on said photo-sensitive, semiconductor switching element for activation thereof;

thermally-sensitive, variable light transmission means interposed in the light path between said light source and said photo-sensitive, semiconductor switching element to vary the light passing through said light transmission means thereby to control said photo-sensitive, semiconductor switching element in response to change in temperature of said thermally-sensitive, variable light transmission means;

said thermally-sensitive, variable light transmission means comprising a liquid crystal element that is relatively opaque at a first range of temperatures and changes to relatively transparent at another range of temperatures and being operable to photo-electrically gate said photo-sensitive semiconductor switching element at a predetermined temperature level between said two temperature ranges;

and means coupling variable heat to said liquid crystal element by the latter being in direct heat transfer relation with said thyristor power switch.

13. An electrical power switching system comprising:
an electric power supply source;
a load device;
means comprising a photo-sensitive, semiconductor switching element operable upon activation thereof for controlling application of power from said source to said load device and a thyristor power switch connected for energizing said load across said source, said thyristor power switch having a pair of power terminals and a gate terminal;

an input terminal for applying an input gating signal to the gate terminal of said thyristor power switch;

said photo-sensitive, semiconductor switching element being connected between said input terminal and said gate terminal;

a light source normally operable to provide light impinging on said photo-sensitive, semiconductor switching element for activation thereof;

thermally-sensitive, variable light transmission means interposed in the light path between said light source and said photo-sensitive, semiconductor switching element to vary the light passing through said light transmission means thereby to control said photo-sensitive, semiconductor switching element in response to change in temperature of said thermally-sensitive, variable light transmission means;

said thermally-sensitive, variable light transmission means comprising a liquid crystal element that is relatively opaque at a first range of temperatures and changes to relatively transparent at another range of temperatures and being operable to photo-electrically gate said photo-sensitive semiconductor switching element at a predetermined temperature level between said two temperature ranges;

and means coupling variable heat to said liquid crystal element by the latter being in direct heat transfer relation with said thyristor power switch.

14. An electrical power switching system comprising:
an electric power supply source;
a load device;
means comprising a photo-sensitive, semiconductor switching element operable upon activation thereof for controlling application of power from said source to said load device;

a light source normally operable to provide light impinging on said photo-sensitive, semiconductor switching element for activation thereof;

thermally-sensitive, variable light transmission means interposed in the light path between said light source and said photo-sensitive, semiconductor switching element to vary the light passing through said light transmission means thereby to control said photo-sensitive, semiconductor switching element in response to change in temperature of said thermally-sensitive, variable light transmission means;

and means coupling variable heat to said thermally-sensitive, variable light transmission means comprising physical attachment of the latter to said photo-sensitive, semiconductor switching element as an integral structure for direct heat transfer therebetween.

15. An electrical load control system comprising:
an electric power supply source;
a load to be controlled by power from said source;
means comprising photo-sensitive load control means operable upon activation thereof for controlling application of power from said source to said load;

a light source normally operable to provide light impinging on said photo-sensitive load control means for activation thereof;

thermally-sensitive, variable light transmission means interposed in the light path between said light source and said photo-sensitive load control means to vary the light passing through said light transmission means thereby to control said photo-sensitive load control means in response to change in temperature of said thermally-sensitive, variable light transmission means;

and means coupling heat from said photo-sensitive load control means to said thermally-sensitive, variable light transmission means.

16. The electrical load control system claimed in claim 15, wherein:
said means comprising photo-sensitive load control means comprises a switching element effective when operated for connecting power from said source to said load;

and said means coupling heat from said load control means comprises means coupling heat from said switching element to said thermally-sensitive, variable light transmission means to vary said light passing therethrough.

* * * * *